(12) United States Patent
Zhu et al.

(10) Patent No.: US 7,186,466 B2
(45) Date of Patent: Mar. 6, 2007

(54) LOW CONDUCTIVITY AND SINTERING-RESISTANT THERMAL BARRIER COATINGS

(75) Inventors: Dongming Zhu, Westlake, OH (US); Robert A. Miller, Brecksville, OH (US)

(73) Assignees: Ohio Aerospace Institute, Cleveland, OH (US); The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 24 days.

(21) Appl. No.: 11/282,859

(22) Filed: Nov. 17, 2005

(65) Prior Publication Data

US 2006/0078750 A1 Apr. 13, 2006

Related U.S. Application Data

(60) Division of application No. 10/928,496, filed on Aug. 27, 2004, now Pat. No. 7,001,859, which is a continuation-in-part of application No. 09/904,084, filed on Jul. 12, 2001.

(60) Provisional application No. 60/263,257, filed on Jan. 22, 2001.

(51) Int. Cl.
B32B 15/01 (2006.01)

(52) U.S. Cl. .................. 428/632; 428/633; 428/701; 428/702; 428/699; 416/241 B (58) Field of Classification Search ............ 416/241 B, 416/223 R, 224, 241 R; 428/632, 633, 701, 428/702, 699; 501/102, 103
See application file for complete search history.

(56) References Cited

U.S. PATENT DOCUMENTS

| | | | |
|---|---|---|---|
| 3,634,113 A | 1/1972 | Fehrenbacher | |
| 3,645,894 A | 2/1972 | Krystyniak | |
| 3,957,500 A | 5/1976 | Pitts | |
| 4,055,705 A | 10/1977 | Stecura et al. | |
| 4,205,051 A | 5/1980 | Takahashi et al. | |
| 4,399,199 A | 8/1983 | McGill et al. | |
| 4,535,033 A | 8/1985 | Stecura | |
| 4,588,655 A | 5/1986 | Kushner | |
| 4,996,117 A | 2/1991 | Chu et al. | |
| 5,238,886 A | 8/1993 | Luszcz et al. | |
| 5,652,044 A | 7/1997 | Rickerby | |
| 5,843,585 A | 12/1998 | Alperine et al. | |
| 5,975,852 A | 11/1999 | Nagaraj et al. | |
| 6,020,075 A | 2/2000 | Gupta et al. | |
| 6,025,078 A | 2/2000 | Rickerby et al. | |
| 6,044,830 A | 4/2000 | Jones | |
| 6,168,874 B1 | 1/2001 | Gupta et al. | |
| 6,210,812 B1 | 4/2001 | Hasz et al. | |
| 6,440,575 B1 | 8/2002 | Heimberg et al. | |
| 6,620,525 B1* | 9/2003 | Rigney et al. | 428/633 |
| 6,686,060 B2* | 2/2004 | Bruce et al. | 428/633 |
| 6,812,176 B1 | 11/2004 | Zhu et al. | |
| 6,890,668 B2* | 5/2005 | Bruce et al. | 428/632 |
| 6,916,551 B2* | 7/2005 | Torigoe et al. | 428/633 |
| 6,960,395 B2* | 11/2005 | Spitsberg et al. | 428/632 |

FOREIGN PATENT DOCUMENTS

WO 94/08069 4/1994

OTHER PUBLICATIONS

Dongming Zhu, et al., Thermophysical and Thermomechanical Properties of Thermal Barrier Coating Systems, pp. 623-633, Ceramic Engineering and Science Proceedings, vol. 21, 2000.

Dongming Zhu, et al., "Thermal Conductivity and Elastic Modulus Evolution of Thermal Barrier Coatings Under High Heat Flux Conditions", pp. 175-180, Journal of Thermal Spray Technology, vol. 9(2), Jun. 2000.

Dongming Zhu et al., "Furnace Cyclic Behavior of Plasma-Sprayed Zirconia-Yttria and Multi-Component Rare Earth Oxide Doped Thermal Barrier Coatings", pp. 1-13, 26th Annual International Conference on Advanced Ceramics and Composites, Jan. 13-18, 2002, NASA/TM-2002-211690.

Dongming Zhu et al., "Thermal Conductivity and Stability of $HfO_2-Y_2O_3$ and $La_2Zr_2O_7$ Evaluated for 1650° C. Thermal/Environmental Barrier Coating Applications", pp. 1-9, 105th Annual Meeting and Exposition of the American Ceramic Society, Apr. 27-30, 2003, NASA/TM-2003-212544.

Dongming Zhu et al., "Defect Clustering and Nanophase Structure Characterization of Multicomponent Rare Earth-Oxide-Doped Zirconia-Yttria Thermal Barrier Coatings", pp. 1-11, NASA/TM 2004-212480, Jan. 2004.

Dongming Zhu et al., "Thermal Conductivity and Sintering Behavior of Advanced Thermal Barrier Coatings", pp. 1-10, NASA/TM-2002-211481, May 2002.

* cited by examiner

*Primary Examiner*—Paul Marcantoni
(74) *Attorney, Agent, or Firm*—Pearne & Gordon LLP (57) ABSTRACT

A thermal barrier coating composition is provided. The composition has a base oxide, a primary stabilizer, and at least two additional cationic oxide dopants. Preferably, a pair of group A and group B defect cluster-promoting oxides is used in conjunction with the base and primary stabilizer oxides. The new thermal barrier coating is found to have significantly lower thermal conductivity and better sintering resistance. In preferred embodiments, the base oxide is selected from zirconia and hafnia. The group A and group B cluster-promoting oxide dopants preferably are selected such that the group A dopant has a smaller cationic radius than the primary stabilizer oxide, and so that the primary stabilizer oxide has a small cationic radius than that of the group B dopant.

25 Claims, 1 Drawing Sheet

LOW CONDUCTIVITY AND SINTERING-RESISTANT THERMAL BARRIER COATINGS

CROSS-REFERENCE TO RELATED APPLICATIONS

This application is a divisional of U.S. patent application Ser. No. 10/928,496 filed Aug. 27, 2004, now U.S. Pat. No. 7,001,859 which is a continuation-in-part of U.S. patent application Ser. No. 09/904,084 filed Jul. 12, 2001, which claims priority of U.S. provisional patent application Ser. No. 60/263,257 filed Jan. 22, 2001.

STATEMENT OF GOVERNMENT SPONSORED RESEARCH

This invention was made with government support under Contract No. NCC3-617 awarded by NASA. The government has certain rights in this invention.

FIELD OF THE INVENTION

The invention relates to a low conductivity thermal barrier coating, in particular to such a coating containing zirconia and/or hafnia, and a combination of rare earth oxides and/or certain other oxides.

BACKGROUND OF THE INVENTION

Thermal barrier coatings are thin ceramic layers that are used to insulate air-cooled metallic components from high temperature gases, for example in gas turbine or other heat engines. Such coatings are useful in protecting and extending the service life of metallic components exposed to high temperatures, such as jet engine turbine blades and combustor components. Thermal barrier coatings composed of yttria-stabilized zirconia are known, wherein the yttria typically makes up seven to nine weight percent (or four to five molar percent) of the total composition. These coatings are typically applied using plasma spraying or physical vapor deposition techniques in which melted ceramic particles or vaporized ceramic clouds are deposited onto the surface of the component that is to be protected. Thermal barrier coatings are somewhat porous with overall porosities generally in the range of 5 to 20%. This porosity serves to reduce the coating's effective thermal conductivity below the intrinsic conductivity of the dense ceramic, as well as to improve the coating's strain tolerance. However, the coating conductivity will increase as the porosity decreases in high temperature service due to ceramic sintering.

In a jet engine, higher operating temperatures generally lead to greater efficiency. However, higher temperatures also cause more problems such as higher stresses, increased materials phase instability and thermal oxidation, leading to premature failure of components. A ceramic coating with lower thermal conductivity and improved high temperature stability would allow higher operating temperatures while preserving operating life of the coated component. Accordingly there is a need for thermal barrier coatings with a lower conductivity and better sintering resistance than prior art coatings. Such a coating ideally would retain low conductivity after many hours of high temperature service. A laser test, recently developed by the current inventors has allowed simultaneous testing of durability, conductivity, and conductivity increase due to sintering under turbine-level high heat flux conditions. See, e.g., Dongming Zhu and Robert A. Miller, "Thermal Conductivity and Elastic Modulus Evolution of Thermal Barrier Coatings under High Heat Flux Conditions," *Journal of Thermal Spray Technology* Vol. 9(2) June 2000 pp. 175–180, and "Thermophysical and Thermomechanical Properties of Thermal Barrier Coating systems," *Ceramic Engineering and Science Proceedings*, Vol. 21, 2000 pp. 623–633, both of which are incorporated herein by reference. The thermal barrier coating advances described in this application have had the benefit of this new test approach.

SUMMARY OF THE INVENTION

A thermal barrier coating composition is provided, having 46–97 molar percent base oxide, 2–25 molar percent primary stabilizer, 0.5–25 molar percent group A dopant, and 0.5–25 molar percent group B dopant. The base oxide is selected from the group consisting of $ZrO_2$, $HfO_2$ and combinations thereof, the primary stabilizer is selected from the group consisting of $Y_2O_3$, $Dy_2O_3$, $Er_2O_3$ and combinations thereof; the group B dopant is selected from the group consisting of $Nd_2O_3$, $Sm_2O_3$, $Gd_2O_3$, $Eu_2O_3$ and combinations thereof; and the group A dopant is selected from the group consisting of rare earth oxides, alkaline earth metal oxides, transition metal oxides and combinations thereof, but excluding those species contained in the base oxide, group B dopant and primary stabilizer groups. The ratio of the molar percentages of group A dopant to group B dopant in the composition is between about 1:10 and about 10:1.

A further thermal barrier coating composition is provided, having a ceramic alloy solid solution having a base oxide lattice structure or structures where the base oxide is present in the solid solution in an amount of 46–97 molar percent. The solid solution further includes 2–25 molar percent primary stabilizer, 0.5–25 molar percent group A dopant, and 0.5–25 molar percent group B dopant. The base oxide is selected from the group consisting of $ZrO_2$, $HfO_2$ and combinations thereof, and the primary stabilizer is selected from the group consisting of $Y_2O_3$, $Dy_2O_3$, $Er_2O_3$ and combinations thereof. Each of the group A dopant and the group B dopant is selected from the group consisting of rare earth oxides, alkaline earth metal oxides, transition metal oxides and combinations thereof, but excluding those species contained in the base oxide and primary stabilizer groups. The group A dopant is selected such that the ionic radius of the group A dopant cation is smaller than the ionic radius of the primary stabilizer cation in the solid solution. The group B dopant is selected such that the ionic radius of the group B dopant cation is larger than the ionic radius of the primary stabilizer cation in the solid solution. The ratio of the molar percentages of group A dopant to group B dopant in the solid solution is between about 1:10 and about 10:1.

A turbine blade structure also is provided. The turbine blade structure has a metallic turbine blade substrate and a ceramic thermal barrier coating thereover. The ceramic thermal barrier coating has a ceramic alloy solid solution having 46–97 molar percent base oxide, 2–25 molar percent primary stabilizer, 0.5–25 molar percent group A dopant, and 0.5–25 molar percent group B dopant. The base oxide is selected from the group consisting of $ZrO_2$, $HfO_2$ and combinations thereof; the primary stabilizer is selected from the group consisting of $Y_2O_3$, $Dy_2O_3$, $Er_2O_3$ and combinations thereof, and each of the group A dopant and the group B dopant is selected from the group consisting of rare earth oxides, alkaline earth metal oxides, transition metal oxides and combinations thereof, but excluding those species contained in the base oxide and primary stabilizer groups. The group A dopant is selected such that the ionic radius of the group A dopant cation is smaller than the ionic radius of the primary stabilizer cation in the solid solution, and the group B dopant is selected such that the ionic radius of the group B dopant cation is larger than the ionic radius of the primary stabilizer cation in the solid solution. The ratio of the molar percentages of group A dopant to group B dopant in the solid solution is between about 1:10 and about 10:1.

DETAILED DESCRIPTION OF THE PREFERRED EMBODIMENTS OF THE INVENTION

As used herein, all percentages are given as molar percents unless otherwise indicated. As used herein, when a preferred range such as 5–25 (or 5 to 25) is given, this means preferably at least 5 and, separately and independently, preferably not more than 25.

Also as used herein, the intrinsic or material thermal conductivity of a material refers to the material's thermal conductivity measured as a physical property of a nonporous, dense solid sample of the material, whereas the effective or superficial thermal conductivity of a material refers to the material's effective thermal conductivity measured for a porous sample of the material. Generally, a porous material's effective or superficial thermal conductivity will be lower than the material's intrinsic thermal conductivity because the porous network of the material limits or reduces the pathways thermal energy can take through the material.

Also as used herein, the notation x-y-z, where x, y and z each is a decimal or whole number such as 4 or 1.33 or 1.67, refers to a composition for a ceramic alloy solid solution or thermal barrier coating having x mol. % primary stabilizer, y mol. % group A dopant and z mol. % group B dopant, with the balance being base oxide as those components are described herein.

The present invention provides a substantial improvement to ceramic thermal barrier coatings that have been used to coat high temperature service components, for example in jet engines. Such components include, but are not limited to, turbine blades as well as combustor components. As explained above, these components conventionally have been coated with a ceramic coating of yttria-stabilized zirconia, typically about 3.9–4.55 mol. % $Y_2O_3$ (about 7–8 wt. %), balance $ZrO_2$ and impurities. For plasma sprayed coatings, as initially laid down the coatings provide suitably low effective thermal conductivity, k~1.0 W/m-K. However, the effective thermal conductivity of these coatings tends to increase rather markedly after several hours of high temperature service, and values of 1.15, 1.19 and 1.5, W/m-K have been observed experimentally after 30 hours of service for such coatings having 0.25 mm thickness at temperatures of 990, 1100 and 1320,° C., respectively. This observed increase in thermal conductivity (from 15% to as high as 50% after only 30 hours) dramatically shortens the useful life of the coated part because the part is exposed to far greater thermal stress as a result of more thermal energy being conducted through the coating. The thermal barrier coating becomes less effective at performing its thermal shielding function because its capacity to conduct thermal energy to the coated part increases with time under high temperature conditions.

The observed increase in effective thermal conductivity in the conventional plasma sprayed ceramic coatings is due to sintering of the ceramic material at the elevated service temperatures, which essentially closes up or "fills in" the porous network of the ceramic layer. As a result of the reduced porosity, the effective thermal conductivity of the layer approaches the dense ceramic's intrinsic thermal conductivity (about 2.5 W/m-K for 4.55 mol. % yttria-stabilized zirconia) as the coating continues to become more continuously solid and less porous. In addition, microcracks (on the order of 1 to 10 microns or less) present in the native, as-applied ceramic coatings, particularly those deposited via plasma spray, are believed to be an efficient barrier to conductive heat transfer through the coating, contributing to the overall low effective conductivities observed for these coatings. The finer of these microcracks, (about 1 micron width or less) can be healed or filled in as a result of sintering, further elevating the effective thermal conductivity toward the dense ceramic's intrinsic conductivity. Also, as the coating becomes more dense due to sintering it exhibits a corresponding increase in its elastic modulus, thus increasing the elastic strain energy in the coating and causing reduced durability especially upon thermal cycling.

The present invention is based on the discovery that the incorporation of certain dopant oxides in various proportions into the ceramic coating matrix can stabilize the porous ceramic coating against sintering via a defect clustering effect. In addition, it has been found that certain combinations of dopant oxides also impart a greater stability against thermal cycling to the ceramic coating matrix. The result of the above effects is that a high-temperature service component that is coated with a ceramic thermal barrier according to the present invention will have a substantially improved useful service life, can be operated at higher temperature, and will be more resistant to thermal cycling resulting from, e.g., an aircraft's flight schedule. It also has been found that certain combinations of dopant oxides may impart enhanced erosion resistance to the thermal barrier coatings. The coatings according to the invention, and particularly the dopant oxides referred to above, are described in detail below.

In its broadest aspect, a thermal barrier coating according to the invention is comprised of a ceramic alloy solid solution having at least the following four components: 1) a base oxide, 2) a primary stabilizer, 3) a group A dopant, and 4) a group B dopant.

In a first preferred embodiment, the thermal barrier coating according to the present invention has the following preferred formulation or table of components listed in table 1. In table 1, any preferred or less preferred molar percent or molar percent range for any component can be combined with any preferred or less preferred molar percent or molar percent range for any of the other components; it is not necessary that all or any of the molar percents or molar percent ranges come from the same column.

TABLE 1

TABLE OF COMPONENTS

MOLAR PERCENTS

| | Less Preferred | Less Preferred | Preferred |
|---|---|---|---|
| Base Oxide | 60–93 | 82–91 | 86 |
| | 46–97 | 73–92 | 84–89 |
| Primary Stabilizer | 4–17 | 6–12 | 8–9 |
| | 3–20 | 4–14 | 7–10 |
| | 2–25 | | |
| Group A Dopant | 0.9–8 | 1.75–4.5 | 2.5 |
| | 0.8–9 | 1.5–5 | |
| | 0.7–10 | 1.25–6 | |
| | 0.5–12 | 1–7 | |
| | 0–25 | | |
| Group B Dopant | 0.9–8 | 1.75–4.5 | 2.5 |
| | 0.8–9 | 1.5–5 | |
| | 0.7–10 | 1.25–6 | |
| | 0.5–12 | 1–7 | |
| | 0–25 | | |

The base oxide is the primary component in the solid solution, meaning that the base oxide is present therein in an amount preferably greater than 50 mol. %, more preferably 60 mol. %, more preferably 70 or 80, mol. %. In any event, the base oxide should represent the highest mol. % concentration in the ceramic alloy solid solution relative to any other single component therein. The base oxide represents the balance of the ceramic alloy solid solutions described herein, excepting impurities, after accounting for the molar percent concentrations of the primary stabilizer, group A dopant and group B dopant, which collectively make up the total dopant oxides. For example, a ceramic alloy solid solution having 4.mol. % primary stabilizer, 3 mol. % group A dopant and 3 mol. % group B dopant, has 90 mol. % base oxide and impurities (100 mol. %−4 mol. %−3 mol. %−3 mol. %=90 mol. %). As used herein, whenever a base oxide is said to represent the "balance" of a ceramic alloy solid solution or ceramic thermal barrier coating, it is to be understood that this is not intended necessarily to exclude the presence of any impurities.

The base oxide most preferably is selected from either zirconia ($ZrO_2$), hafnia ($HfO_2$) or a combination of these. Zirconia may be preferred because of its relatively low cost, wide availability and the fact that coating manufacturers already are broadly familiar with zirconia-based ceramic thermal barrier coatings, including techniques for their application to desired substrates. However, the applicants have observed very good sintering resistance and low thermal conductivity for hafnia-based coatings as well when doped according to the invention.

The primary stabilizer is a species effective to fully or partially "stabilize" the cubic phase of the base oxide. This avoids the relatively large volume change associated with phase transformation during heating or cooling the pure base oxide, e.g. zirconia, as it transforms from the low temperature monoclinic phase to a higher temperature tetragonal phase. A fully stabilized base oxide will be cubic across a broad temperature range. A partially stabilized base oxide may be partly cubic or it may contain a certain quenched-in phase known as t' (the tetragonal t' phase described elsewhere herein), for example t'-zirconia. Oxide stabilizers generally cause a decrease in the intrinsic thermal conductivity of the base oxide ceramic (zirconia or hafnia) as a result of increased vacancies and atomic weight associated with the stabilizing oxide additions. Such stabilizers, as well as their effect of lowering intrinsic thermal conductivity, are well known in the art. For example, it is known that the addition of yttria ($Y_2O_3$) in minor amounts to zirconia ($ZrO_2$) causes the material thermal conductivity of the primarily zirconia matrix to be reduced. This has been the basis for conventional ceramic thermal barrier coatings, which utilize 4.55 mol % (~8 wt. %) yttria-stabilized zirconia, commonly referred to in the art as "8YSZ". Conventionally, yttria ($Y_2O_3$) is the most common primary stabilizer species, and ceramic coatings made from 4.55 mol. % yttria-stabilized zirconia (8YSZ) are well known in the art. Alternatively, the primary stabilizer can be any other species present in an amount effective to stabilize, and therefore to reduce the intrinsic thermal conductivity of, the solid solution relative to the base oxide alone, including dysprosia ($Dy_2O_3$), less preferably erbium oxide ($Er_2O_3$), or combinations of these and/or yttria.

The group A and B dopants preferably are provided in smaller amounts compared to the base oxide, and are responsible for providing the defect clustering effect mentioned above, and more fully described below. The group A and B dopants both are cationic oxides, preferably both rare earth oxides. The group A dopant is selected such that the ionic radius of the group A dopant cation will be smaller than the ionic radius of the primary stabilizer cation in the solid solution. Conversely, the group B dopant is selected such that the ionic radius of the group B dopant cation will be larger than the ionic radius of the primary stabilizer cation in the solid solution. In other words, the group A dopant cationic radius is smaller than that of the primary stabilizer, whose cationic radius in turn is smaller than that of the group B dopant.

The group A dopant is preferably scandia oxide ($Sc_2O_3$) or ytterbium oxide ($Yb_2O3$), less preferably combinations of these, less preferably nickel (II) oxide (NiO), chromium (III) oxide ($Cr_2O_3$), cobalt (II) oxide CoO, iron (III) oxide ($Fe_2O_3$), magnesium (II) oxide (MgO), less preferably titanium (IV) oxide ($TiO_2$), ruthenium (IV) oxide ($RuO_2$), tantalum oxide ($Ta_2O_5$) or combinations of any of the foregoing, less preferably any other rare earth oxide (excluding erbium oxide ($Er_2O_3$)), alkaline earth metal oxide, transition metal oxide, or combinations of any of the foregoing, so long as the cationic radius of the group A dopant is smaller than the cationic radius of the primary stabilizer that is selected. Among scandia and ytterbia, ytterbia may be more preferred due to its lower cost.

The group B dopant is preferably neodymium oxide ($Nd_2O_3$) or gadolinium oxide ($Gd_2O_3$), less preferably samarium oxide ($Sm_2O_3$), less preferably europium oxide ($Eu_2O_3$), or combinations of any of these.

Other additives known in the art may also be added in conventional amounts. Because of the difficulty in separating rare earth metals from each other, the listed percentages indicate that the given component (base oxide, primary stabilizer dopant, group A dopant, group B dopant) consists essentially of the given metal oxide compound, with allowance for impurities normally tolerated from commercially available sources. The components of the composition are combined according to techniques known or conventional in the art to form the desired ceramic thermal barrier coating composition.

The group A and group B dopants are preferably present in substantially equal molar percentages in the solid solution for the thermal barrier composition. Less preferably the group A and group B dopants are present in a molar percent ratio between 1.1:1 to 1:1.1, less preferably 1.5:1 to 1:1.5, less preferably 1:2 and 2:1, less preferably 1:4 to 4:1, less preferably 1:8 to 8:1, group A and group B dopants together in the above proportions into a ceramic alloy solid solution matrix having as its primary component zirconia and/or hafnia as the base oxide, in addition to a relatively minor amount of yttria, results in the solid solution matrix exhibiting a substantially reduced intrinsic thermal conductivity, as well as both a reduced effective or superficial thermal conductivity (which is lower than the intrinsic thermal conductivity), and a reduce tendency for the effective thermal conductivity to rise after hours of high-temperature service.

Without wishing to be bound by any particular theory, it is believed that this highly surprising and unexpected result is achieved for at least one of the following reasons.

As discussed above the present invention involves the addition of both group A and group B dopant oxides to the zirconia (hafnia)-yttria or other zirconia (hafnia) based systems. The group A and group B dopants are believed to serve three functions.

First, the group A and B dopants preferably are present in substantially equimolar ratios so as to provide essentially paired oxide complexes in the base oxide (zirconia) lattice. The group A and group B dopant oxides are generally highly stable, possessing respectively smaller and larger cationic radii than that of the primary stabilizer dopant, most preferably yttria. In the base oxide solid solution lattice, these paired oxides (groups A and B) cooperate to provide thermodynamically stable, highly distorted, defective lattice structures based on local ionic segregation (defect clustering) with controlled ranges of defect cluster sizes, resulting in a highly distorted lattice in the ceramic alloy solid solution. These complex structures effectively attenuate and scatter lattice phonon waves as well as radiative photon waves at a wide spectrum of frequencies, thus significantly reducing the oxide lattice intrinsic and radiation thermal conductivities.

Second, the resulting defect clusters are substantially immobile in the solid solution's highly distorted lattice structure. These essentially immobile defect clusters, themselves or in combination with other induced nanoscale ordered phases, effectively reduce the mobile defect concentration in the base oxide lattice and suppress atomic mobility and mass transport, thus significantly improving the oxide sintering-creep resistance.

Third, it has been observed that ceramic thermal barrier coatings made as described herein exhibit substantially improved mechanical properties, including improved fracture toughness as well as durability, believed due to the formation of complex nanoscale defect clusters.

The one or more pairs of additional dopants (group A and B dopant oxides) incorporated in the base oxide matrix (preferably $ZrO_2$ or $HfO_2$ based oxides) preferably have cationic valences that are either less than or greater than that of the base oxide cation, less preferably equal to that of the base oxide cation. For example, in the preferred embodiment where $ZrO_2$ is the base oxide, the zirconium cation has a +4 valence, $Zr^{4+}$, meaning the dopant oxides (group A and B dopants) preferably are selected having cationic valences of +1, +2 or +3, which are less than that of zirconium in $ZrO_2$, or valences of +5 or larger, which is greater than that of zirconium in $ZrO_2$. It is less preferred in the case where zirconia is the base oxide to have a group A or B dopant oxide whose cationic valence is equal to +4. In any case, however, it is important that the dopant oxides have a substantially different cationic radius than that of the base oxide ($Z^{4+}$ in the preferred embodiment) in order to achieve the desired defect clustering effect. By selecting the group A and B dopants according to the valence considerations described in this paragraph, a high concentration of highly associated defects is produced in the solid solution matrix which is stabilized based on electroneutrality conditions. Strong dopant-oxygen vacancy and dopant-dopant interactions are believed to exist which promote the formation of extended, immobile defect clusters.

It was mentioned above that the group A and B dopant oxides are selected in part based on their high stability. Stability of these oxides is governed by their free energy of formation ($\Delta G_f$), where a more (higher magnitude) negative value indicates greater stability as is well known in the art. The one or more pairs of additional dopants, (group A and B dopant oxides are one such pair), incorporated in the base oxide matrix ($ZrO_2$ and/or $HfO_2$ based systems) preferably are selected so as to possess high (large magnitude negative value) free energies of formation. High free energy of formation of a dopant oxide represents high stability of the oxide in an oxygen-containing atmosphere, which is greatly desirable. The addition of dopant oxides with mixed polarization and ionic sizes may further introduce lattice defects and distortion for reduced thermal conductivity and improved sintering-creep resistance.

High dopant atomic weight is beneficial for improving lattice scattering. High dopant solubility is beneficial for increasing dopant concentrations and thus defect concentrations. A mixture of high- and low-solubility dopants and of high- and low-atomic weight will promote complex structures and thus improved lattice scattering.

Figure 1:
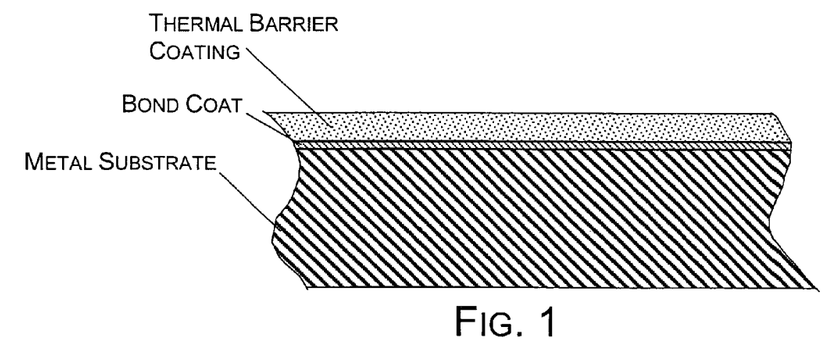
FIG. 1 is a sectioned side view of a metallic substrate having a ceramic thermal barrier coating according to the invention applied thereto. A metallic bond coat layer, which is optional but highly preferred, is provided intermediate the thermal barrier coating and the substrate. The substrate can be, e.g., a turbine blade for a jet engine, a combustor, or any other component that is subjected to high temperature service, particularly high temperature thermal cycling as in a jet engine.

The compositions according to the invention preferably are used to provide a ceramic thermal barrier coating on metal components subject to high service temperatures, such as turbine blades in jet engines. The coatings may be applied to the substrate using methods known in the art, for example via a plasma spray technique or physical vapor deposition. Most preferably, a metallic bond coat layer made from or substantially comprising an oxidation-resistant metal or metal alloy is deposited first onto the substrate surface, and the cerarmic thermal barrel coating deposited over the bond coat layer. Metallic bond coat layers are known in the art and typically are applied via a conventional vapor deposition technique to a thickness of about 3–7, more typically about 5, mils. Suitable bond coat materials are MCrAlX alloys as known in the art, where M≡ is a metal selected from nickel, cobalt, iron, and combinations thereof, Cr≡ chromium; Al≡ aluminum; and X≡ an optional active metallic element, most commonly yttrium. Pt—Al (platinum-aluminum) alloys also are common for the bond coat layer. Broadly, the bond coat layer typically is an aluminum alloy where aluminum provides the oxidation resistance to the layer, and the other alloying elements are present in amounts sufficient to improve (reduce) the brittleness and raise the melting temperature of the bond coat above the service temperature for the coated substrate. The bond coat layer is highly preferred in order to prevent oxidation of the underlying metallic substrate which often is not all that oxidation resistant. For example, turbine blades commonly are manufactured of a nickel superalloy that will be readily oxidized from atmospheric oxygen at operating temperatures over 2000° F. The bond coat is preferred because a thermal barrier coating alone may not sufficiently prevent oxidation of the underlying substrate because such coatings, often comprising primarily porous zirconia in the coating layer, can be oxygen permeable and/or also relatively effective oxygen conductors at elevated temperatures even when the coating layer is dense. Once the bond coat layer has been deposited onto the substrate, the ceramic thermal barrier coating composition is applied over the bond coat layer via conventional techniques to provide the ceramic thermal barrier coating according to the invention.

Most preferably, the composition is applied such that the resulting coating exhibits primarily a crystalline phase that is either cubic, tetragonal t' or primarily a combination of these. The cubic phase of a crystalline ceramic such as zirconia or hafnia, as well as for other oxides encompassed by the present description, is very well known in the art and does not require further explanation here. The tetragonal t' phase referred to herein also is known to those skilled in this art, but is somewhat less common and bears some explanation for the convenience of the reader. The tetragonal t' phase of a ceramic crystal is a non-equilibrium state of the crystal exhibiting a tetragonal crystalline structure which generally is not apparent from the conventional phase diagram for the crystal, e.g. phase diagrams for conventional $ZrO_2$—$Y_2O_3$ systems do not show this phase. It results when the base material becomes supersaturated with the dopant, conventionally $Y_2O_3$, in the case of the invention the sum of all the dopants. It is a non-equilibrium or metastable state and is converted to the equilibrium cubic phase as additional dopant(s) is/are added. Though it is a non-equilibrium state, the tetragonal t' phase of zirconia or hafnia generally persists up to temperatures of about 1200° C. (2192° F.) at which point it will be gradually converted to the more stable cubic phase. The tetragonal t' phase inevitably also includes substantial micro-scale regions of other phases scattered throughout the bulk phase, which result in improved defect scattering and the resultant improved durability described below.

It is to,be understood that nothing in the foregoing paragraph or elsewhere in this application is intended to imply that only the cubic and/or tetragonal t' phases will or are to be present in the solid solutions for the ceramic coatings of the present invention. The solid solutions inevitably will have regions or pockets of various crystalline phases, including cubic, tetragonal, tetragonal t', monoclinic, etc., depending on the conditions under which a particular coating was deposited and its service environment. In addition, a coating may have two or more discrete regions having the same crystalline phase, but which are not continuous—i.e. the lattice structures of two adjacent phases may both be cubic, but the two phases nevertheless are discontinuous and meet at a discrete interface as known in the art.

It has been found in applications using the ceramic thermal barrier coatings according to the invention that cubic phase coatings generally have lower intrinsic thermal conductivity, better phase stability, and also higher concentrations of defect clusters as described above which result in greater sintering stability across a very wide temperature range. On the other hand, tetragonal t' phase coatings have been found to be more durable and resistant to erosion from physical impact events (i.e. they are tougher coatings), and also have exhibited greater resistance to thermal cycling compared to counterpart cubic phase coatings. It will be understood by persons of ordinary skill in the art that the choice of whether to provide a substantially cubic or a substantially tetragonal t' phase coating will greatly depend on the particular application, such as the temperatures, number and frequency of actual or potential physical impact events and/or degree of thermal cycling experienced by the substrate to be coated. Of course, in certain applications it also may be desirable to provide a coating having some measure of both cubic and tetragonal t' phases in order to provide the benefits of each of these phases.

Figure 2:
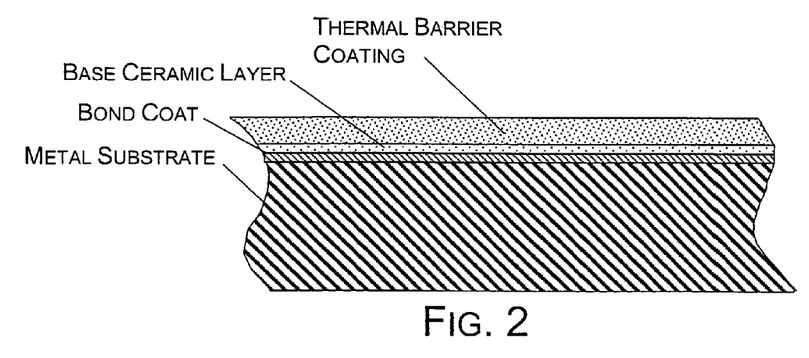
FIG. 2 is a sectioned side view as in FIG. 1, incorporating an additional ceramic layer intermediate the metallic bond coat layer and the thermal barrier coating layer according to the invention.

The zirconia-based ceramic thermal barrier coatings having a substantially cubic phase described above exhibit substantially reduced intrinsic thermal conductivity as already discussed, and also have relatively high thermal expansion coefficients. The combination of these two properties, along with a lower degree of toughness compared to the tetragonal t' phase counterparts, can increase the potential for thermal shock damage and premature delaminations, especially near edges or sharp bends in coated components (e.g. the edge of a turbine blade) where high stress concentrations and non-uniformity of the temperature distributions are to be expected. To counteract this potentially negative effect, it is preferable first to lay down a base ceramic layer prior to depositing the thermal barrier coating according to the invention. The base ceramic layer advantageously can be a conventional 7YSZ or 8YSZ (7 or 8 weight percent respectively, yttria-stabilized zirconia) layer, and preferably has a thickness in the range of 0.5–2 mils (about 0.5–1 mil for a PVD applied base ceramic layer). Such a 7YSZ or 8YSZ coating has a somewhat lower thermal expansion coefficient, and also a relatively higher thermal conductivity compared to the superjacent cubic zirconia-based thermal barrier coating according to the invention, and its properties generally are intermediate the underlying metallic bond coat layer (or substrate) and the thermal barrier coating. Such a two-layer ceramic coating system (base ceramic layer of conventional 7- or 8YSZ ceramic and superjacent thermal barrier layer according to the invention) has demonstrated significant increased useful life and resistance to thermal cycling, while maintaining optimum low thermal conductivity performance and temperature capability, in terms of both intrinsic conductivity and sintering resistance for the superjacent thermal barrier coating layer. Additional layer grading between these two ceramic layers in terms of compositions and properties also can be incorporated in order to improve the two coatings' stability and compatibility. Alternatively, the base ceramic layer can be a tetragonal t' phase low conductivity thermal barrier coating layer, and/or can have an as-applied thickness in the range of 10 to 50 µm. This base ceramic layer is preferred for zirconia-based thermal barrier coatings according to the invention, and not necessarily for hafnia-based coatings; though it is believed the base ceramic layer would not be detrimental to a hafnia-based coating.

Generally, when zirconia is used as the base oxide, total dopant concentrations (sum of primary stabilizer, group A and group B dopants) greater than about 6 mol. % result in the ceramic thermal barrier coating being substantially in the cubic phase. Total dopant concentrations in the range of 4–6 mol. % result in a mixed phase coating having substantial regions of both cubic and tetragonal t' phases, and total dopant concentrations less than about 4 mol. % result in a substantially tetragonal t' crystalline phase for the coating. When hafnia is used as the base oxide, it has been found that the cubic to tetragonal t' phase transition occurs in the range of about 10–15 mol. % total dopant concentration, where 15 mol. % results in a substantially cubic phase coating and below 10 mol. % results in a substantially tetragonal t' phase.

The inventors herein have identified a number of compositions which provide highly desirable ceramic thermal barrier coatings according to the invention, for the case where either zirconia or hafnia is selected as the base oxide. Zirconia is relatively inexpensive and less heavy compared to hafnia and so may be preferred in a wide range of applications. It is generally suitable in applications up to about 2800° F. (1540° C.). However, where it is necessary to provide a coating for a substrate that will experience higher temperatures, the higher cost of hafnia may be justified, which generally is suitable in applications above 2800° F.

When zirconia is selected as the base oxide, it has been found, surprisingly and unexpectedly, that total dopant concentrations in the range of about 9–13 mol. %, more preferably about 10–12 mol. %, result in a dramatic reduction in intrinsic thermal conductivity for the ceramic coating. This, coupled with enhanced sintering resistance due to the defect clustering effect resulting from the paired oxides (group A and B dopants), results in a superior ceramic thermal barrier coating having 1) lower intrinsic thermal conductivity, 2) lower effective thermal conductivity in the porous coating, and 3) a far greater service life because the low effective thermal conductivity is sustained for a longer period of time due to the enhanced sintering resistance of the material. For zirconia-based systems, the following compositions in table 2 have been identified as producing highly desirable coatings. In table 2, all values are molar percent.

TABLE 2

| Primary Stabilizer | Group A Dopant | Group B Dopant | Base Oxide (zirconia) |
|---|---|---|---|
| 4 | 3 | 3 | Balance |
| 4 | 4 | 4 | Balance |
| 6 | 3 | 3 | Balance |
| 6 | 2 | 2 | Balance |
| 8.5 | 0.75 | 0.75 | Balance |

It will be evident based on the foregoing description that each of the compositions in table 2 is primarily in the cubic phase due to the fact that the total dopant concentrations are in the range of 10–12 mol. %. More durable, erosion resistant coatings can be produced by lowering the total dopant concentration below about 6 mol. %, preferably about 4 to 6 mol. %, to produce a solid solution incorporating substantial regions in the tetragonal t' phase as explained above. Desirable examples include 1.33 mol. % primary stabilizer, 1.33 mol. % group A dopant and 1.33 mol. % group B dopant, balance zirconia, as well as 1.67 mol. % primary stabilizer, 1.67 mol. % group A dopant and 1.67 mol. % group B dopant, balance zirconia. Particularly desirable ceramic alloy solid solutions based on these compositions for the tetragonal t' phase, and on the compositions in table 2 for the cubic phase, have been made where yttria ($Y_2O_3$) is the primary stabilizer, ytterbia ($Yb_2O_3$) is the group A dopant, and gadolinia ($Gd_2O_3$) is the group B dopant. The 1.33-1.33-1.33 composition just described has been found to be highly suitable for producing very durable ceramic thermal barrier coatings for turbine blades in jet engines. It is believed that suitable tetragonal t' phase compositions also can be prepared based on the proportions of the compositions listed in table 2, by multiplying each component concentration by about ⅓. For example, the analogous tetragonal t' composition for the cubic 4-3-3 composition in table 2 would be 1.33-1-1. In this case, the sum of all three dopant concentrations is 3.33 mol. %, which is below the ~4 mol. % threshold for a substantially tetragonal t' phase coating. Alternatively, the multiplier can be a different value, such as in the range of ⅓ to ½ (e.g. 0.4), so long as the resulting sum of all three dopant concentrations does not exceed the ~4 mol. % threshold. A similar calculation could be performed for each of the cubic phase compositions in table 2 to achieve an analogous tetragonal t' phase composition. In a further alternative, where a mixed phase having substantial regions of cubic and tetragonal t' phases is desired, other suitable multipliers can be used to provide an analogous composition having the same component proportions as any of the compositions listed in table 2, where total dopant concentration is in the range of about 4–6 mol. %.

The 4-3-3 composition where the individual components are selected to be the species as in the preceding paragraph also is highly suitable for producing a cubic phase coating for those turbine blades where low intrinsic (and accordingly superficial or effective) thermal conductivity is a more important consideration than hardness or resistance to thermal cycling. In addition, the 4-3-3 and 6-2-2 compositions discussed above also are believed highly suitable for coating jet engine combustor components.

In general, when zirconia is selected as the base oxide, the composition of the ceramic alloy solid solution preferably is $ZrO_2$—$Y_2O_3$—$REa_2O_3$—$REb_2O_3$ (base oxide—primary stabilize—group A dopant—group B dopant) where REa is a first rare earth oxide whose cationic radius is smaller than $Y^{3+}$ in the solid solution, and REb is a second rare earth oxide whose cationic radius is larger than $Y^{3+}$ in the solid solution. In this embodiment, most preferably REa is scandia ($Sc_2O_3$) or ytterbia ($Yb_2O_3$), and REb is neodymia ($Nd_2O_3$), gadolinia ($Gd_2O_3$) or samaria ($Sm_2O_3$), and all the components are present in a molar percent concentration according to one of the compositions listed in tables 1 or 2 above or in one of Examples 1–4 below.

When hafnia is used as the base oxide, it has been found that a dramatic decrease in intrinsic thermal conductivity similar to that observed for zirconia-based systems also is found in hafnia-based cubic phase systems, but in the range of 15–20 mol. % total dopant concentration. Accordingly, hafnia-based ceramic alloy solid solutions having compositions of 11-2-2 and 16-2-2 have been found to be desirable. Formulations according to these component concentrations also have been made using yttria, ytterbia and gadolinia respectively for the primary stabilizer, group A and group B dopants, and have been found to exhibit desirably low intrinsic thermal conductivity and enhanced sintering resistance.

In addition to the group A and B dopants mentioned above, it has been found that the addition of a third additional dopant in relatively small amounts can have a substantially beneficial effect on further reducing the intrinsic thermal conductivity of the resulting ceramic alloy solid solution, as well as reducing the tendency for the coatings according to the invention to crack due to thermal shock. Preferably, the third additional dopant is scandia ($Sc_2O_3$) and is in addition to the group A and group B dopants already being added to the composition. (In other words, though scandia is listed hereinabove as a preferred group A dopant, in this embodiment when it is presented as a third additional dopant or "overdopant," it is not intended as the group A dopant, and a different group A dopant oxide, preferably ytterbia is used as the group A dopant oxide). The resulting scandia-modified, low conductivity cluster oxide thermal barrier coating provides an optimal combination of low thermal conductivity performance and coating durability. When a small amount, preferably in the range of 0.5 to 6 mol. %, more preferably 0.5–1 mol. %, of $Sc_2O_3$ is added to the previously disclosed four component, low conductivity thermal barrier coatings ($ZrO_2$—$Y_2O_3$—$REa_2O_3$—$REb_2O_3$, where REa and REb are rare earths other than Y), one can effectively reduce and/or tailor the thermal expansion coefficient of the resulting oxide systems. The addition of scandia to the clustered oxide systems also enhances the oxide atomic bonding because of the high affinity between scandium and oxygen, thus resulting in high chemical stability and intrinsic strength of the modified oxides. Therefore, the thermal shock resistance and coating long-term durability of the modified thermal barrier coatings can be greatly improved while maintaining the very low coating thermal conductivity. The addition of this third additional dopant provides an overall 5-component system, and the resulting effect on thermal conductivity is described in the Examples below where the third additional dopant is referred to as an "overdopant."

The thicknesses of the ceramic thermal barrier coatings described herein will depend on the method of application, which in turn will be dictated by the particular substrate to be coated and the service conditions it experiences. Thicker coatings will be desirable for more strenuous temperature and thermal cycling environments, whereas thinner coatings would be suitable for less strenuous environments. The two principal methods for applying these coatings are physical vapor deposition (PVD) and plasma spray. Both techniques are well known to those skilled in the art, and are not further described here except to note that PVD generally applies thinner coatings than plasma spray. For PVD applied coatings, e.g. onto turbine blades, coating thicknesses of 1–10, preferably 2–9, preferably 3–8, preferably 4–7, preferably about 5, mils are applied. For plasma spray applied coatings, e.g. onto a combustor surface, coating thicknesses are somewhat higher, preferably 10–40, preferably 11–35, preferably 12–30, preferably 13–25, preferably 15–20, mils. Generally, thinner coatings are preferred for moving parts, and particularly for parts moving at high speed in circular paths such as turbine blades, due to weight and centrifugal load considerations, the heavier the turbine blades (and their coatings) the greater the centrifugal load on the turbine blade as it is accelerated in a circular path, which can result in creep of the underlying metallic substrate.

For plasma sprayed coatings according to the invention, it is desirable that the ceramic alloy powder used in the plasma spray process not have too many fines. Preferably, the ceramic alloy powder used for plasma spray application of a ceramic thermal barrier coating according to the invention will comprise not more than about 40, preferably about 35, preferably about 30, preferably about 25, preferably about 20, preferably about 15, preferably about 10, percent on a mass basis of particles smaller than about 325 mesh. It also is preferable that the ceramic alloy powder be sprayed using plasma torch parameters which are selected so as to ensure that the particles are well-melted.

The following Examples (table 3) further illustrate various aspects of the invention. Examples 1–4 each show the components of a preferred embodiment of the invention, the amounts of the ingredients to produce the respective coating, and the resulting thermal conductivity observed after 20-hour high temperature testing at about 1316° C. (2400° F.) in steady-state laser conductivity tests. The overdopant present in Example 4 was selected to achieve a composition including two different species of group A dopants (i.e. dopants whose cationic radii are small than that of the primary stabilizer). Example 5 shows the baseline control sample, a standard yttria-stabilized zirconia or 8YSZ. Percentages are given in molar percent.

|  | Example: | | | | |
|---|---|---|---|---|---|
|  | 1 | 2 | 3 | 4 | 5 |
| Base Oxide | Zirconia balance | Zirconia balance | Zirconia balance | Zirconia balance | Zirconia balance |
| Primary Stabilizer | Yttria 3 mol % | Yttria 9 mol % | Yttria 9 mol % | Yttria 14 mol % | Yttria 4.5 mol % |
| Group A dopant | Ytterbia 1.5 mol % | Ytterbia 2.25 mol % | Ytterbia 2.25 mol % | Ytterbia 7 mol % | 0 |
| Group B dopant | Samaria 1.5 mol % | Neodymia 2.25 mol % | Gadolinia 2.25 mol % | Neodymia 7 mol % | 0 |
| Overdopant | 0 | 0 | 0 | Scandia 0.75 mol % | 0 |
| Thermal Conductivity (W/m-K) | 0.72 | 0.63 | 0.70 | 0.56 | 1.35 |

As these results demonstrate, the presence of the matched pairs of over- and under-sized cationic oxide dopants (group A and B dopants) according to the present invention reduces the 20-hour thermal conductivity of the coatings. The coating sintering resistance at high temperature is also significantly improved, as indicated by the significantly lowered rates of the conductivity increase. The magnitude of increases in thermal conductivity after 20 hours in coatings according to the present invention were generally approximately 25–50% less than the magnitude of increase observed in similarly applied prior art 4.55 mol % yttria stabilized zirconia coatings. The foregoing results were surprising and unexpected.

Although the invention has been described with respect to preferred embodiments, it will be understood that various changes and modifications can be made thereto without departing from the spirit and scope of the invention as set forth in the appended claims.

What is claimed is:

1. A turbine blade structure comprising a metallic turbine blade substrate and a ceramic thermal barrier coating thereover, said ceramic thermal barrier coating comprising a ceramic alloy solid solution comprising 46–97 molar percent base oxide, 2–25 molar percent primary stabilizer, 0.5–25 molar percent group A dopant, and 0.5–25 molar percent group B dopant, said base oxide being selected from the group consisting of $ZrO_2$, $HfO_2$ and combinations thereof, said primary stabilizer being selected from the group consisting of $Y_2O_3$, $Dy_2O_3$, $Er_2O_3$ and combinations thereof, each of said group A dopant and said group B dopant being selected from the group consisting of rare earth oxides, alkaline earth metal oxides, transition metal oxides and combinations thereof, but excluding those species contained in said base oxide and primary stabilizer groups, wherein said group A dopant is selected such that the ionic radius of the group A dopant cation is smaller than the ionic radius of the primary stabilizer cation in said solid solution, and wherein said group B dopant is selected such that the ionic radius of the group B dopant cation is larger than the ionic radius of the primary stabilizer cation in said solid solution, the ratio of the molar percentages of group A dopant to group B dopant in said solid solution being between about 1:10 and about 10:1.

2. A turbine blade structure according to claim 1, each of said group A and group B dopants being a rare earth oxide.

3. A turbine blade structure according to claim 1, said ceramic alloy solid solution comprising 9–13 molar percent total dopants, including the primary stabilizer, group A dopant and group B dopant.

4. A turbine blade structure according to claim 1, said ceramic alloy solid solution comprising 4 molar percent yttria, 3 molar percent ytterbia and 3 molar percent gadolinia, balance base oxide and impurities.

5. A turbine blade structure according to claim 1, said ceramic alloy solid solution having a substantially cubic crystalline structure.

6. A turbine blade structure according to claim 1, further comprising a metallic bond coat disposed intermediate said substrate and said thermal barrier coating.

7. A turbine blade structure according to claim 1, further comprising a ceramic base layer adjacent said thermal barrier coating and disposed intermediate said thermal barrier coating and said substrate.

8. A turbine blade structure according to claim 7, said ceramic base layer comprising 8 weight percent yttria-stabilized zirconia or 7 weight percent yttria-stabilized zirconia.

9. A turbine blade structure according to claim 1, said ceramic thermal barrier coating being applied via a physical vapor deposition technique and having a thickness of 1–10 mils.

10. A turbine blade structure according to claim 9, said thickness being about 5 mils.

11. A turbine blade structure according to claim 1, said solid solution further comprising, in addition to said group A dopant, 0.5 to 6 molar percent scandia as an additional overdopant.

12. A turbine blade structure according to claim 1, wherein said group A dopant is selected such that the ionic radius of the group A dopant cation is smaller than the ionic radius of the primary stabilizer cation in said solid solution, and wherein said group B dopant is selected such that the ionic radius of the group B dopant cation is larger than the ionic radius of the primary stabilizer cation in said solid solution.

13. A combustor component for a jet engine, comprising a metallic combustor component substrate and a ceramic thermal barrier coating thereover, said ceramic thermal barrier coating comprising a ceramic alloy solid solution comprising 46–97 molar percent base oxide, 2–25 molar percent primary stabilizer, 0.5–25 molar percent group A dopant, and 0.5–25 molar percent group B dopant, said base oxide being selected from the group consisting of $ZrO_2$, $HfO_2$ and combinations thereof, said primary stabilizer being selected from the group consisting of $Y_2O_3$, $Dy_2O_3$, $Er_2O_3$ and combinations thereof, each of said group A dopant and said group B dopant being selected from the group consisting of rare earth oxides, alkaline earth metal oxides, transition metal oxides and combinations thereof, but excluding those species contained in said base oxide and primary stabilizer groups, wherein said group A dopant is selected such that the ionic radius of the group A dopant cation is smaller than the ionic radius of the primary stabilizer cation in said solid solution, and wherein said group B dopant is selected such that the ionic radius of the group B dopant cation is larger than the ionic radius of the primary stabilizer cation in said solid solution, the ratio of the molar percentages of group A dopant to group B dopant in said solid solution being between about 1:10 and about 10:1.

14. A combustor component according to claim 13, each of said group A and group B dopants being a rare earth oxide.

15. A combustor component according to claim 13, said ceramic alloy solid solution comprising 9–13 molar percent total dopants, including the primary stabilizer, group A dopant and group B dopant.

16. A combustor component according to claim 13, said ceramic alloy solid solution comprising 4 molar percent yttria, 3 molar percent ytterbia and 3 molar percent gadolinia, balance base oxide and impurities.

17. A combustor component according to claim 13, said ceramic alloy solid solution having a substantially cubic crystalline structure.

18. A combustor component according to claim 13, further comprising a metallic bond coat disposed intermediate said substrate and said thermal barrier coating.

19. A combustor component according to claim 13, further comprising a ceramic base layer adjacent said thermal barrier coating and disposed intermediate said thermal barrier coating and said substrate.

20. A combustor component according to claim 19, said ceramic base layer comprising 8 weight percent yttria-stabilized zirconia or 7 weight percent yttria-stabilized zirconia.

21. A combustor component according to claim 13, said ceramic thermal barrier coating being applied via a physical vapor deposition technique and having a thickness of 1–10 mils.

22. A combustor component according to claim 21, said thickness being about 5 mils.

23. A combustor component according to claim 13, said solid solution further comprising, in addition to said group A dopant, 0.5 to 6 molar percent scandia as an additional overdopant.

24. A combustor component according to claim 13, wherein said group A dopant is selected such that the ionic radius of the group A dopant cation is smaller than the ionic radius of the primary stabilizer cation in said solid solution, and wherein said group B dopant is selected such that the ionic radius of the group B dopant cation is larger than the ionic radius of the primary stabilizer cation in said solid solution.

25. A structure comprising a metallic substrate and a ceramic thermal barrier coating over said substrate, said substrate being selected from the group consisting of a turbine blade and a combustor component for a jet engine, said ceramic thermal barrier coating comprising a ceramic alloy solid solution comprising 46–97 molar percent base oxide, 2–25 molar percent primary stabilizer, 0.5–25 molar percent group A dopant, and 0.5–25 molar percent group B dopant, said base oxide being selected from the group consisting of $ZrO_2$, $HfO_2$ and combinations thereof, said primary stabilizer being selected from the group consisting of $Y_2O_3$, $Dy_2O_3$, $Er_2O_3$ and combinations thereof, each of said group A dopant and said group B dopant being selected from the group consisting of rare earth oxides, alkaline earth metal oxides, transition metal oxides and combinations thereof, but excluding those species contained in said base oxide and primary stabilizer groups, wherein said group A dopant is selected such that the ionic radius of the group A dopant cation is smaller than the ionic radius of the primary stabilizer cation in said solid solution, and wherein said group B dopant is selected such that the ionic radius of the group B dopant cation is larger than the ionic radius of the primary stabilizer cation in said solid solution, the ratio of the molar percentages of group A dopant to group B dopant in said solid solution being between about 1:10 and about 10:1.

* * * * *